United States Patent [19]

Kiriseko et al.

[11] Patent Number: 4,825,093
[45] Date of Patent: Apr. 25, 1989

[54] METHODS FOR IDENTIFYING SEMICONDUCTOR WAFER WITH BAR CODE PATTERN THEREON AND METHODS FOR MANUFACTURING SEMICONDUCTOR DEVICE

[75] Inventors: Tadashi Kiriseko, Kanagawa; Nobuo Iijima, Tama, both of Japan

[73] Assignee: Fujitsu Limited, Kawasaki, Japan

[21] Appl. No.: 51,398

[22] Filed: May 19, 1987

[30] Foreign Application Priority Data

May 20, 1986 [JP] Japan .................. 61-116422
Jun. 18, 1986 [JP] Japan .................. 61-142533

[51] Int. Cl.$^4$ ............................................. G06K 7/10
[52] U.S. Cl. .................................. 250/566; 250/568; 235/462
[58] Field of Search ............... 250/566, 568, 569, 570, 250/271; 235/462, 463, 468, 487, 464, 494; 437/924, 245, 246, 187, 194, 197; 219/121 LH; 209/3.3

[56] References Cited

U.S. PATENT DOCUMENTS

| | | | |
|---|---|---|---|
| 4,010,355 | 3/1977 | Roehrman et al. | 250/566 |
| 4,134,066 | 1/1979 | Vogel et al. | 437/924 |
| 4,233,091 | 11/1980 | Kawabe | 437/924 |
| 4,348,803 | 9/1982 | Sasaki | 250/568 |
| 4,538,059 | 8/1985 | Rudland | 235/468 |

OTHER PUBLICATIONS

Patent Abstracts of Japan, vol. 10, No. 197, Jul. 10, 1986 & JP-A-61 42 119.
Patent Abstracts of Japan, vol. 7, No. 58, Mar. 10, 1983 & JP-A-57 206 042.
Patent Abstracts of Japan, vol. 8, No. 115, May 29, 1984 & JP-A-59 29 433.
Solid State Technology, vol. 22, No. 6, Jun. 1979, "Coding and Decoding of Wafers", B.I.C.F. Van Pul, pp. 77-79.
IBM Technical Disclosure Bulletin, vol. 25, No. 1, Jun. 1982, "Laser-Written and Read Symbol Set of High Radix", by Nielsen et al., pp. 319-322.

Primary Examiner—David C. Nelms
Assistant Examiner—Michael Messinger
Attorney, Agent, or Firm—Staas & Halsey

[57] ABSTRACT

In an automatic wafer process for gate array integrated circuits, it becomes necessary to identify the wafer every time at the beginning of each process. However, it is difficult for conventional methods to identify the wafer by detecting a bar code pattern because of a low contrast due to reflection of the deposited layers. The present invention provides a method in which the light source, which abundantly includes infrared rays, located on the back side of the wafer and a detector located on the front side thereof. The infrared rays are irradiated onto the wafer easily penetrate the silicon wafer. The infrared rays are received without an effect of reflection due to the deposited layers on the front side of the wafer. The first metallization layer is a very suitable layer to form the bar code pattern, which is easily marked by a laser beam scriber.

15 Claims, 4 Drawing Sheets

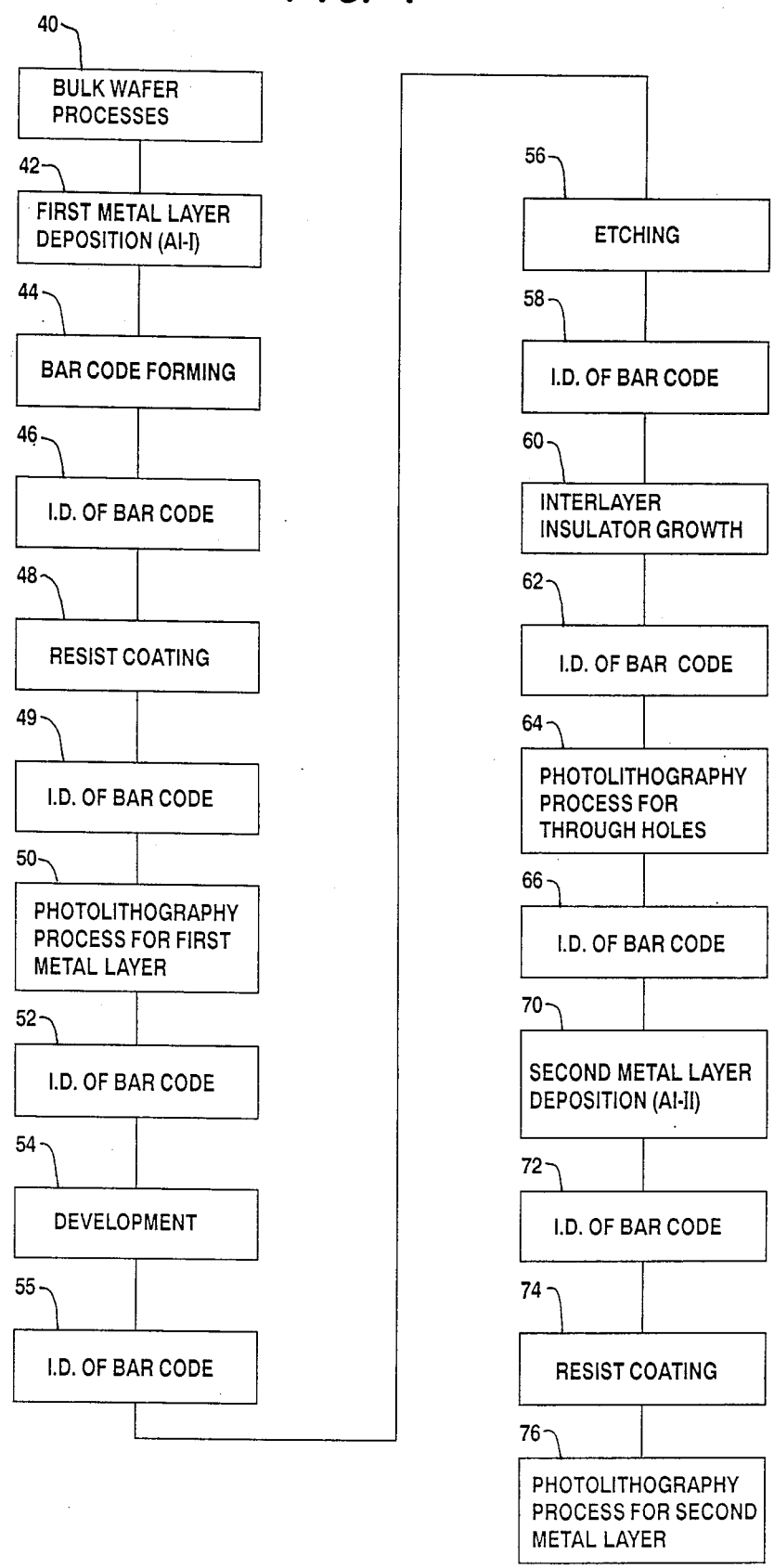

METHODS FOR IDENTIFYING SEMICONDUCTOR WAFER WITH BAR CODE PATTERN THEREON AND METHODS FOR MANUFACTURING SEMICONDUCTOR DEVICE

BACKGROUND OF THE INVENTION

1. Field of the Invention

The present invention relates to a method of identifying a semiconductor wafer in fabrication processes utilizing a bar code pattern formed theron, and a method for manufacturing a semiconductor device. More particularly, this invention relates to obtaining a better contrast in detecting a bar code pattern, and is especially suitable for the fabrication processes of semiconductor wafers, in which a different metal pattern of an integrated circuit is required after the same prior bulk processes are finished.

2. Description of the Prior Art

When semiconductor wafer are planned for fabrication of gate array integrated circuits, the bulk wafer processes are the same for steps prior to the first metallization process. Because such wafers are subjected to a different patterning process for a metal layer depending on a designed logic circuit, it is required that a code pattern for each circuit be formed at a time just before the patterning process for the first metallization.

Generally, identifying an individual wafer is not necessary for a typical process of the integrated circuits. Because many wafers in a same lot, which are usually carried in the same wafer carrier, are subject to the same process, a lot identification of wafers is enough to identify the process. However, in a metallization process of gate array integrated circuits, a production quantity using the same metal pattern is extremely limited. Therefore, it is necessary that each wafer should be individually identified in every step on and after the first metal patterning process.

With the progress of automation of production, a bar code pattern is more practical because it is suitable for an automatic recognition utilizing a bar code reader. The conventional method of forming a bar code pattern for identification of individual wafers is to utilize a photolithography technique for the metal layer, which is separately patterned for a specific requirement.

The bar code pattern thus formed in the metal layer is subsequently subjected to the formation processes of an insulating layer, a second metallization when required, a passivation layer, and the like. In each process, the identification of each wafer in the prior art utilizes the method of applying light to the surface of the wafer from the front side thereof, receiving the reflected light, and detecting the bar code pattern.

When the bar code pattern is formed on the wafer surface itself, the problem is more serious. Because the deposited layers on the bar code pattern layer have different reflection factors and flat surfaces so as to cause a multiple reflection of the light for detection, it is difficult to get a clear and distinct detection signal from the bar code pattern. Furthermore, the bar code pattern is liable to be damaged during the wafer processes so that the bar code may be incorrectly identified. Sometimes it becomes impossible to decode the signal. Even for a case in which the naked eye can recognize the code pattern, an automatic identification thereof can become impossible.

SUMMARY OF THE INVENTION

It is a general object of the invention, therefore to provide a method of identifying a semiconductor wafer in an easier way with accuracy, even when a code pattern is covered with a plurality of insulating layers.

It is another object of the invention to provide a method of identifying automatically a semiconductor wafer without the help of visual perception.

It is still another object of the invention to provide a method of forming a bar code pattern in an easier and simpler way.

In the prior art, the incident light is applied to the front surface of a semiconductor wafer, and the reflected light from wafer is received by a detector. In this case, a detected signal from the bar code pattern area includes the random reflected light from deposited layers formed thereon.

In the present invention, the light source is provided on the back side of the wafer and the transmitted light is received and detected on the front side thereof. This arrangement greatly eliminates random reflected light experienced in the prior art. A light source including infrared rays is suitable for this purpose because a silicon wafer can easily transmit infrared rays.

In the case of using transmitted light through the silicon wafer, the bar code pattern is desirable to be formed by a metal layer which effectively interrupts the transmission of light except areas where the metal layer is removed.

As the metal layer for marking the bar code pattern, the first metal layer (usually aluminum layer) for connections of active elements in a chip area can be commonly used. Though the bar code pattern can be formed by conventional photolithography techniques, it should be formed before the photolithography process of the first metal layer when forming the gate array integrated circuits, because identification of the wafer is necessary before the photolithography process for patterning the first metal layer. Therefore it needs a separate photolithography process for forming the bar code pattern.

In the present invention, the bar code pattern is formed by scribing the aluminum layer by a laser beam, and melting and evaporating the aluminum of the scribed area. This method eliminates a photolithography process for the bar code pattern and is very useful to save time.

The present invention may be embodied in other specific forms without departing from the spirit or essential characteristics thereof. For example, the light source and the detecting means may be arranged in the reversed positions. The bar code pattern can be formed on the silicon wafer itself not using the metal layer. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

BRIEF DESCRIPTION OF THE DRAWINGS

FIG. 4 is a flow chart of wafer processes after bulk wafer processes;

DETAILED DESCRIPTION OF THE PREFERRED EMBODIMENTS

Figure 1:
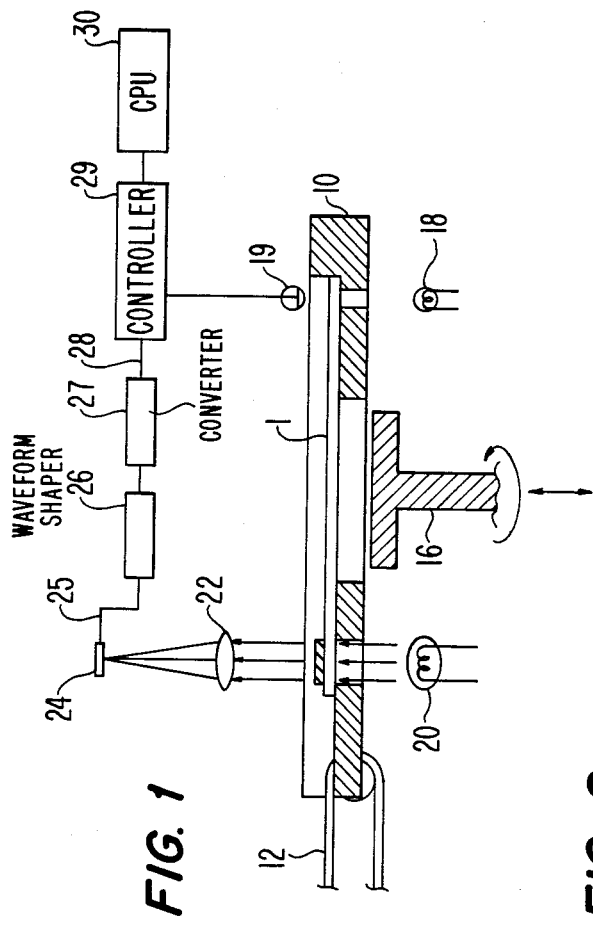
FIG. 1 is a schematic of an apparatus for explaining the method of identifying a semiconductor wafer according to the present invention.
Figure 2:
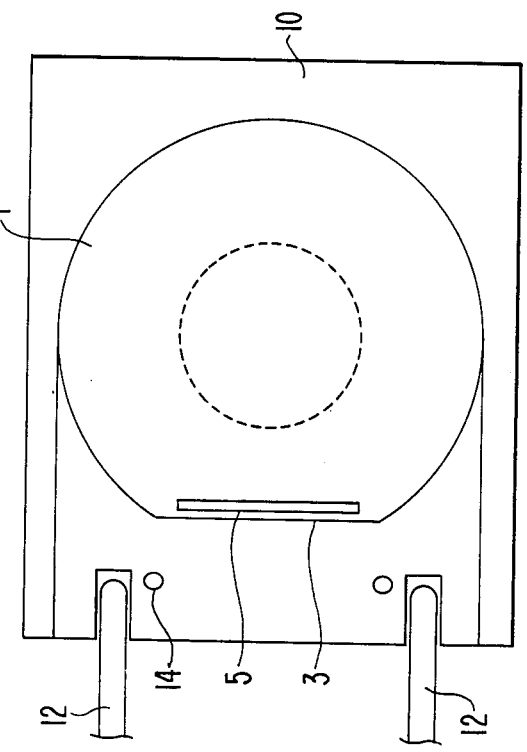
FIG. 2 is a top view of a stage used in the apparatus of FIG. 1.

FIG. 1 is a schematic of an apparatus for explain a method of identifying a semiconductor wafer. FIG. 2 is a top view of a stage 10 of the apparatus loaded with a semiconductor wafer 1.

In FIGS. 1 and 2, a silicon semiconductor wafer 1 is transported on conveyor belt 12 from the left side, and is moved to a seat position with the aid of an air stream from an orifice 14. Then a rotary positioner 16 is raised upward and rotated around its axis as shown by the arrows. A photodiode 18 and a sensor 19 detect the position of an orientation flat 3. When the semiconductor wafer 1 is further rotated to the detecting position as shown in FIG. 2, the positioner 16 is stopped from rotating and is lowered by controller 29.

A light source 20, which includes infrared rays, irradiates the back side of the semiconductor wafer 1. The light source 20 can be a tungsten heater lamp which includes both visible and infrared rays, a helium-neon gas laser which abundantly includes 3.39 μm infrared rays, or other many kinds of semiconductor LEDs and lasers can be used.

Light penetrating through the semiconductor wafer 1 and a bar code pattern 5 formed thereon is received by an image sensor which comprises a lens system 22 and a CCD (charge-coupled-device) detector 24. For the purpose of the present invention, a one dimensional CCD sensor having a 2048 bit resolution is practical and useful.

Figure 3:
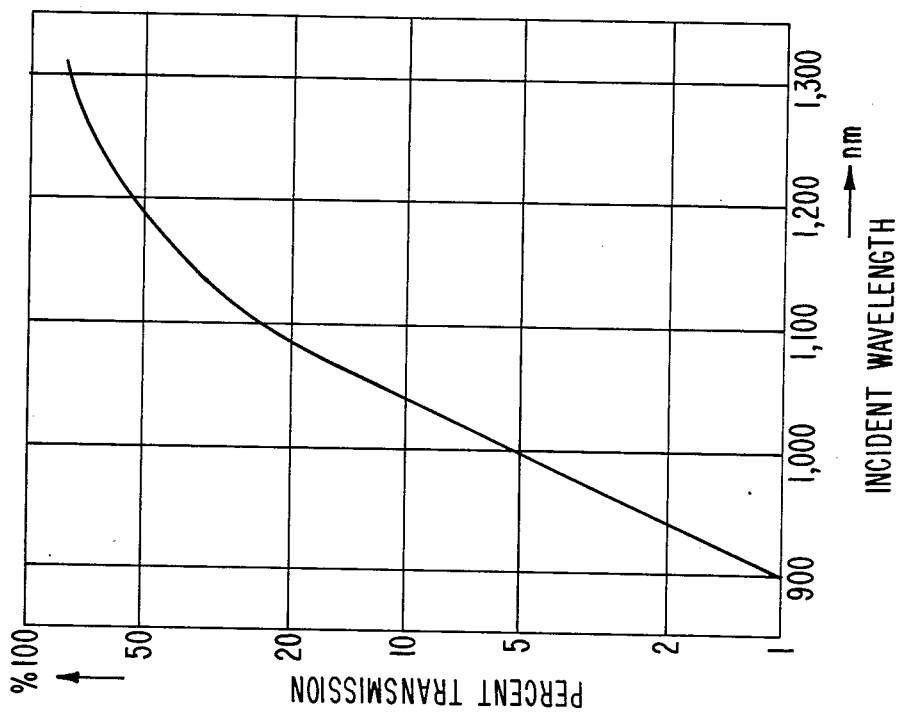
FIG. 3 is a graph of a relationship between an incident wavelength and a percent transmission for a silicon wafer.

Conventional silicon wafers have a thickness of, for example, 600 μm, and become transparent for infrared rays. One example of the relationship between an incident wavelength and a percent transmission through the wafer is shown in FIG. 3. Above a wavelength of 1,300 nm (1.3 μm), most of the incident rays are transmitted through the wafer except for an area covered with a metal layer by which the bar code pattern is formed.

In FIG. 1, the signal 25 detected by CCD detector 24 is input to a waveform shaper 26 and then to a converter 27 for obtaining a binary signal. The binary signal 28 from the converter 27 corresponds to the bar code pattern marked on the wafer and input to a controller 29, in which the semiconductor wafer 1 is identified. A CPU 30, connected to the controller 29, gives further instructions on the subsequent process for the wafer 1.

In production of integrated circuits, a master slice procedure is generally utilized especially for gate array integrated circuits, in which logic gates such as NANDs, NORs and the like are arranged in arrays on a wafer. In such a gate array process, all common bulk wafer processes before the patterning of the first metal layer are completed and the semi-finalized wafers are stored.

On receiving each customer's specifications, a specific mask for the metal patterning is prepared. In production, the above stored wafer is subjected selectively to a specific photolithography process which meets each customer's specification. Therefore the master slice procedure necessitates a variety of mask pattern processes, but a quantity of a production lot is small.

In the master slice procedure above described, it is necessary that a new code number is given to the wafer on which the first metal layer has been already deposited in order to identify each wafers for an individual mask process and etching process of the different metal patterns.

In other words, through the bulk wafer processes every wafer is subject to common processes. On the other hand, after the mask process of patterning the metal layer, each wafer should be identified one by one so as to be subject to different processes. Therefore, it is desirable to form a bar code on the wafer after the bulk wafer process and before the patterning process of the metal layer.

FIG. 4 is a block diagram showing a process flow which is subjected to the master slice procedure. FIGS. 5 through 11 show a partial cross sectional view of a wafer, corresponding to a specific step shown in FIG. 4. With regard to FIGS. 5 through 11, the left side of the figure shows the chip area, and the right side shows the bar code pattern area near the orientation flat edge. In the chip area, only one bipolar transistor is typically shown as an active element.

Figure 5:
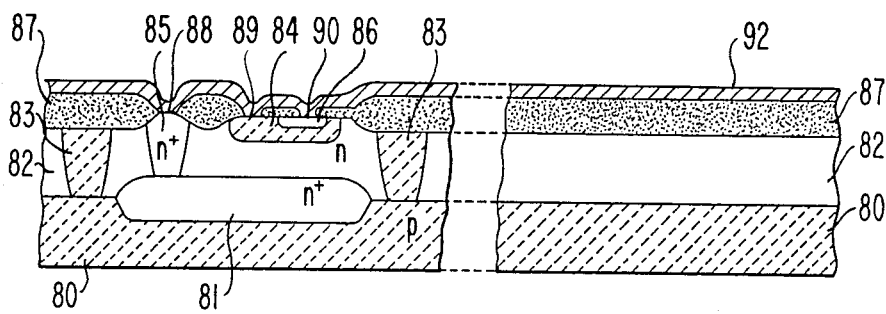
FIGS. 5 through 11 are cross sectional views of a wafer corresponding to sequential steps after the bulk wafer processes, whereby each figure shows both structures of the chip area and the bar code pattern area.
Figure 6:
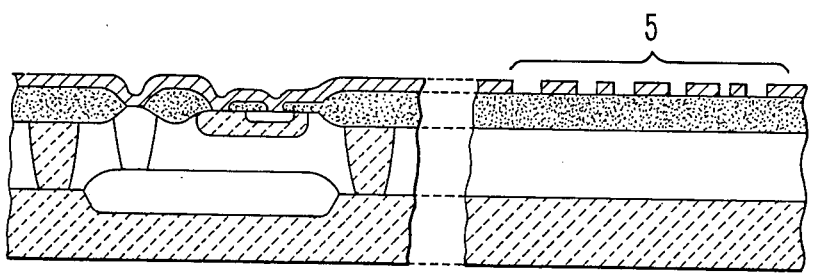

In the following explanations, both FIG. 4 and one of FIGS. 5 through 11 are used. In FIG. 4, all bulk processes before a metal deposition are briefly represented as step 40. When step 42, which includes depositing a metal layer 92 (usually an aluminum layer is used), is finished, the wafer structure shown in FIG. 5 is obtained.

Through the bulk after processes shown in FIG. 5, a p-type silicon substrate 80 is used, and an n+-type buried layer 81 is formed therein. An n-type epitaxial layer 82 is grown thereon. Next, a silicon dioxide filkm 87 (field oxide film) is formed thereon, and then a p+-type isolation region 83 is formed by implanting boron ions. Next, an n+-type collector contact 85, a p-type bse region 84 and an n-type emitter region 86 are formed in successive order by implanting phosphorus or boron impurity ions. Contact openings 88, 89, and 90 are then formed in the silicon dioxide layer 87 for step 42 of the first metallization process (Al-I layer). The above structure shows a popular bipolar transistor and the bulk processes therefor are well known. Therefore, detailed explanations are omitted.

During the bulk wafer processes 40, the surface near the orientation flat edge is also subjected to the same processes except for impurity diffusion. Therefore, the n-type epitaxial layer 82 and the silicon dioxide layer 87 are formed on the p-type silicon substrate 80.

Next, a first metjal layer 92 is deposited on the entire surface. Thus bulk wafer processes are finished at this point, and the structure is shown in FIG. 5.

In a production of the gate array integrated circuit having the specific metal pattern, the bar code pattern is formed on the wafer, which is shown as step 44 in FIG. 4. In the prior art, the bar code pattern is formed by a photolithography technique because only the photolithography technique can make such a fine pattern consisting of a sequence of stripes having a width between 100 to 250 μm. However, photolithography processes needs an additional mask process and a lot of lead time.

Recently remarkable progress in the accuracy of a laser scriber has been made. It has been found that the bar code pattern can be formed by a laser scribing method. For the present object, the laser scriber, which can form a bar code pattern having a width of 100 μm, can be used. When the laser beam spot sweeps the aluminum layer 92 in FIG. 5, aluminum easily melts and evaporates forming the bar code pattern 5 in FIG. 6.

Figure 7:
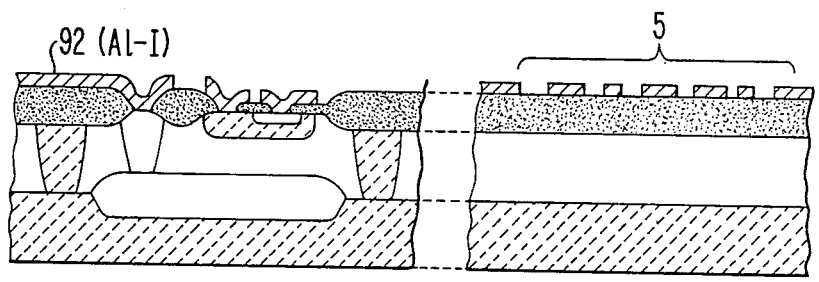

After forming the bar code pattern consisting of a specific type number, a lot number and the like, the wafer is moved to the patterning process of the first aluminum layer referred to as Al-I. This process consists of a series of process steps of forming a resist coating 48, a photolithography process 50 including a selection of a specific mask and exposure processes, development 54, and etching 56. These steps are shown in FIG. 4. However, these steps should be preceded by the identification steps 46, 49, 52, and 55 of the wafer by detecting the bar code 5 according to the present invention, because many wafers are expected to have different types of metal patterns, and are mixed in the same production line. Such detection of the bar code 5 is performed as explained in FIGS. 1 and 2. When Al-T is formed, the structure is shown in FIG. 7.

Figure 8:
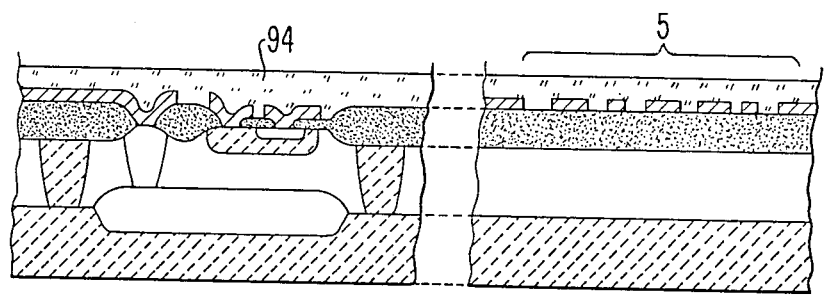

Next, an interlayer insulator 94 is grown on the entire surface (step 60) as in FIG. 8. The material of the interlayer insulator 94 can be silicon dioxide, phospho-silicate-glass (PSG), or silicon nitride.

Figure 9:
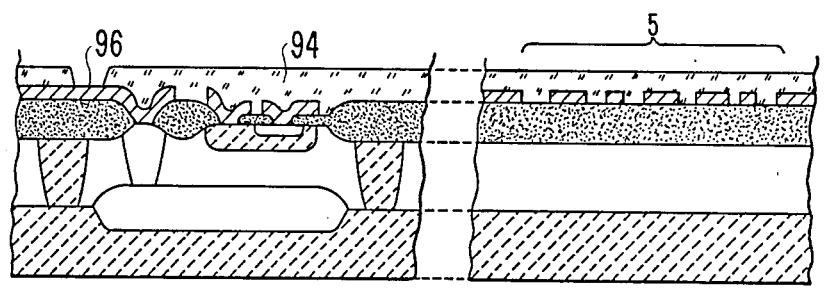

Next, through holes 96 for forming a multilevel interconnection are formed in the interlayer insulator 94 as shown in FIG. 9. In this process, identification step 62 of the wafer and another photolithography process (step 64) are needed, and step 64 also comprises steps of resist coating, another identification of the wafer, selection of a mask, exposure, development, and etching. These steps re briefly put together and represented as single step 64.

Figure 10:
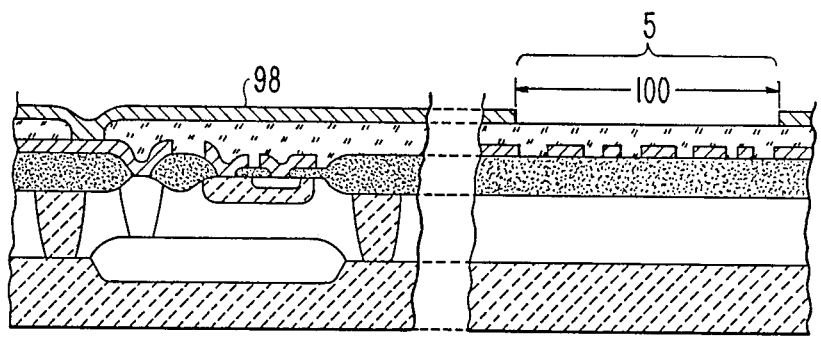

Next step 70 is carried out for a forming a second metal (aluminum) layer 98 as shown in FIGS. 4 and 10. In this process a window 100 should be formed in the metal layer 98, such that the metal layer 98 does not disturb the transmission of light through the wafer around the bar code pattern area.

Figure 11:
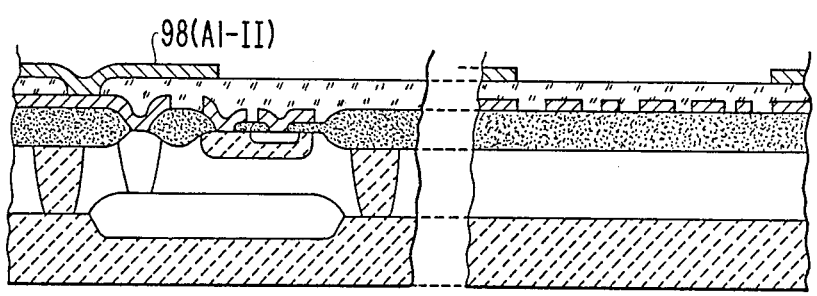

Finally identification step 72 is performed by using the transmission of infrared rays through the wafer substrate at the bar code pattern 5, resist coating step 74 and photolithography step 76 and subsequent steps (the details are just the same as steps 52 through 56 explained in forming Al-I, and are omitted in FIG. 4) are followed. As a result, the second aluminum layer is patterned forming Al-II, which is shown in FIG. 11.

In the foregoing embodiment, the bar code pattern 5 is formed in the first metal (aluminum) layer 92, because the aluminum metal layer is the best material for interrupting the transmission of light.

Figure 12:
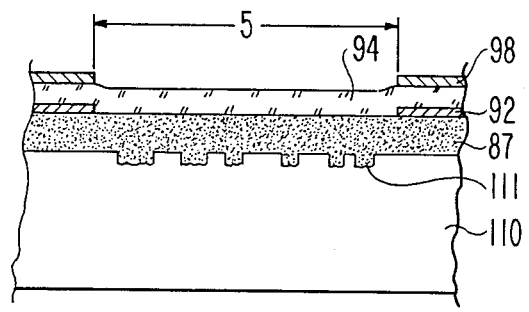
FIG. 12 is a silicon wafer for forming a bar code pattern directly on the silicon wafer.

Experiments also show that the bar code pattern formed on the silicon surface can sufficiently reduce the transmission of infrared rays. As shown in FIG. 12, the bar code pattern which is scribed on the surface of a silicon wafer 110 by a laser beam and is worked to have a rough surface 111 can be used for identification of wafers. Therefore, the present invention can be applied for identifying the bar code pattern which is directly formed on the silicon wafer 110 by laser scribing. In this case, a window is formed for all metal layers 92 and 98 deposited on the bar code pattern area 5 such as the opening window 100 shown in FIG. 10.

Figure 13:
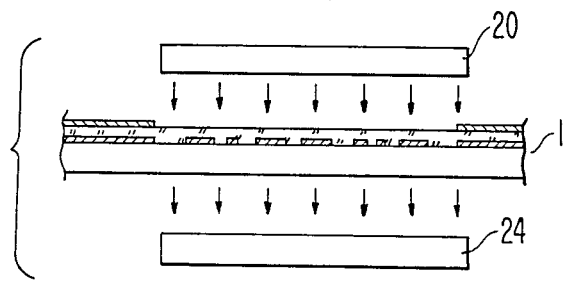
FIG. 13 is another arrangement of a light source and a detecting means.

Moreover, as shown in FIG. 13, the arrangement of the light source 20 and detecting means 24 may be interchanged with respect to each other, so that the light source 20 is located on the front side of semiconductor wafer 1 and the detector 24 is located on the back side thereof. However, experiments prove a better contrast can be obtained in the arrangement wherein the light source is located on the back side and the detector is located on the front side as shown in FIG. 1 and previously explained.

What we claim is as follows:

1. A method for identifying a semiconductor wafer utilizing a bar code pattern formed thereon, said method comprising the steps of:
   (a) depositing a metal layer on the semiconductor wafer, having a low transmission factor with respect to infrared rays;
   (b) forming the bar code pattern with the metal layer;
   (c) irradiating light, including infrared rays onto a first side of the semiconductor wafer;
   (d) receiving the infrared rays transmitted through the semiconductor wafer and the bar code pattern of the metal layer on a second side of the semiconductor wafer; and
   (e) identifying the semiconductor wafer by decoding the received signal.

2. A method for identifying a semiconductor wafer according to claim 1, wherein said step (b) includes forming the bar code pattern on the front side of the semiconductor wafer, said step (c) includes irradiating the infrared rays onto the back side of the semiconductor wafer and said step (d) includes receiving transmitted infrared rays on the front side thereof.

3. A method for identifying a semiconductor wafer according to claim 1, wherein said step (b) includes forming the bar code pattern on the front side of the semiconductor wafer, said step (c) includes irradiating the infrared rays onto the front side of the semiconductor wafer, and said step (d) includes receiving the transmitted infrared rays on the back side thereof.

4. A method for identifying a semiconductor wafer according to claim 1, comprising the substep of forming the metal layer of aluminum.

5. A method for identifying a semiconductor wafer according to claim 4, wherein said bar code pattern is formed by scribing and evaporating said layer with a laser beam.

6. A method for identifying a semiconductor wafer according to claim 1, comprising the step of forming the bar code pattern by scribing and evaporating the metal layer with a laser beam.

7. A method for identifying a semiconductor wafer according to claim 1, wherein said step (a) of depositing the metal layer is deposited as a first metallization layer.

8. A method for identifying a semiconductor wafer according to claim 7, further comprising the step of forming a window above the bar code pattern.

9. A method of manufacturing a semiconductor device comprising the steps of:
   (a) performing common bulk processes for a plurality of semiconductor wafers, including at least impurity introduction into the semiconductor wafers and forming an insulating layer thereon;
   (b) forming a metal layer on the plurality of semiconductor wafers for interrupting infrared rays transmitted to the semiconductor wafers at a first region, where an electrical element is formed, and to a second region where a bar code pattern is formed;

(c) selectively removing the metal layer in the second region, and forming the bar code pattern which corresponds to each of the plurality of semiconductor wafers;

(d) irradiating infrared rays onto the second region from a first side of the semiconductor wafers and detecting the transmitted infrared rays through the semiconductor wafer and the bar code pattern in a second side of the semiconductor wafers and decoding the bar code pattern;

(e) identifying the semiconductor wafers by said decoding step (d); and (f) selectively removing the metal layer, forming a specified metal pattern corresponding to the identification of the semiconductor wafers.

10. A method for manufacturing a semiconductor device according to claim 9, further comprising the steps of:

(g) forming an insulating layer capable of transmitting infrared rays onto the metal layer for forming a specified pattern in the first region and onto the bar code pattern in the second region;

(h) forming an additional second metal layer on an entire surface of the insulating layer;

(i) removing the additional second metal layer above the second region;

(j) irradiating infrared rays onto the second region from a first side of the semiconductor wafer and detecting the transmitted infrared ray through the semiconductor wafer and the bar code pattern in a second side of the semiconductor wafer and decoding the bar code;

(k) identifying the semiconductor wafer by said decoding step (d); and (l) selectively removing the additional second metal layer, forming a specified pattern of the additional second metal layer corresponding to the identification of the semiconductor device.

11. A method for manufacturing a semiconductor device according to claim 10, further comprising the step of forming a gate structure for a gate array in the first region, the metal layer having a specified pattern and being connected to the electrical element in the first region.

12. A method for manufacturing a semiconductor device according to claim 11, further comprising the step of connecting the additional second metal layer having a specified pattern to the metal layer.

13. A method for identifying a semiconductor wafer utilizing a bar code pattern formed thereon, said method comprising the steps of:

(a) exposing a silicon surface of a semiconductor substrate;

(b) forming the bar code pattern by scribing and roughing the silicon surface with a laser beam in a second region of the silicon surface and forming an active element in a first region of the silicon surface;

(c) removing a metal layer subsequently deposited on the second region of the silicon surface and forming a window for infrared rays;

(d) irradiating light, including infrared rays, onto a first side of the semiconductor wafer;

(e) receiving the infrared rays transmitted through the semiconductor wafer and the bar code pattern on a second side of the semiconductor wafer; and (f) identifying the semiconductor wafer by decoding the received signal.

14. A method for identifying a semiconductor wafer according to claim 13, wherein said step (b) includes forming the bar code pattern and an active element on the front side of the semiconductor wafer, said step (d) includes irradiating the infrared rays onto a back side of the semiconductor wafer, and said step (e) includes receiving transmitted infrared rays on the front side of the semiconductor wafer.

15. A method for identifying a semiconductor wafer according to claim 13, wherein said step (b) includes forming the bar code pattern and an active element on a front side of the semiconductor wafer, said step (d) includes irradiating the infrared rays onto the front side of the semiconductor wafer, and said step (e) includes receiving transmitted infrared rays on a back side of the semiconductor wafer.

* * * * *

UNITED STATES PATENT AND TRADEMARK OFFICE
CERTIFICATE OF CORRECTION

PATENT NO. : 4,825,093
DATED : APRIL 25, 1989
INVENTOR(S) : TADASHI KIRISEKO ET AL.

It is certified that error appears in the above-identified patent and that said Letters Patent is hereby corrected as shown below:

Col. 4, line 42, "filkm" should be --film--;

line 45, "bse" should be --base--;

line 59, "metjal" should be --metal--.

Col. 5, line 26, "Al-T" should be --Al-I--;

line 39, "re" should be --are--.

Signed and Sealed this

Twenty-first Day of November, 1989

Attest:

JEFFREY M. SAMUELS

Attesting Officer     Acting Commissioner of Patents and Trademarks